United States Patent [19]

Dayton et al.

[11] Patent Number: 5,543,976
[45] Date of Patent: Aug. 6, 1996

[54] PROVIDING TRANSITIONS OF SLEW RATE DEPENDENT ON PULSE FREQUENCY

[75] Inventors: Birney D. Dayton, Nevada City; Thomas B. Crabb, Grass Valley, both of Calif.

[73] Assignee: Nvision, Inc., Grass Valley, Calif.

[21] Appl. No.: 386,096

[22] Filed: Feb. 9, 1995

[51] Int. Cl.$^6$ ........................................... G11B 5/09
[52] U.S. Cl. .................. 360/46; 360/14.3; 360/66; 360/67
[58] Field of Search ............................ 360/46, 66, 67, 360/10.3, 14.2, 14.3; 330/136, 138, 141, 142, 261, 273, 296

[56] References Cited

U.S. PATENT DOCUMENTS

| | | | |
|---|---|---|---|
| 4,220,929 | 9/1980 | Talbot et al. | 330/136 |
| 4,521,743 | 6/1985 | Heimer | 330/296 |
| 4,521,870 | 6/1985 | Babbel et al. | 364/900 |
| 4,550,349 | 10/1985 | Okuyama et al. | 360/10.2 |
| 4,646,167 | 2/1987 | Denecke | 360/14.3 |
| 4,688,234 | 8/1987 | Robinton | 375/10 |
| 4,704,642 | 11/1987 | Namiki | 360/64 |
| 4,766,328 | 8/1988 | Yang | 307/106 |
| 4,859,955 | 8/1989 | Trethewey | 328/169 |
| 4,935,703 | 6/1990 | Poletto | 330/255 |
| 5,018,027 | 5/1991 | Roggendorf | 360/14.3 |
| 5,136,259 | 8/1992 | Sato et al. | 330/261 |
| 5,155,802 | 10/1992 | Mueller et al. | 395/24 |
| 5,237,461 | 8/1993 | Heitmann et al. | 360/19.1 |
| 5,357,211 | 10/1994 | Bryson et al. | 330/263 |

*Primary Examiner*—W. Chris Kim
*Attorney, Agent, or Firm*—Smith-Hill and Bedell

[57] ABSTRACT

A circuit for processing an input pulse signal of which the slew rate is dependent on pulse frequency comprises an amplifier (30; 78) for receiving the input pulse signal and generating an output pulse signal having transitions of which the slew rate is dependent on a bias current supplied to the amplifier, and a circuit (38–66; 82–108) for supplying bias current to the amplifier, the bias current being representative at least substantially of the frequency of occurrence of pulses in the input pulse signal.

11 Claims, 3 Drawing Sheets

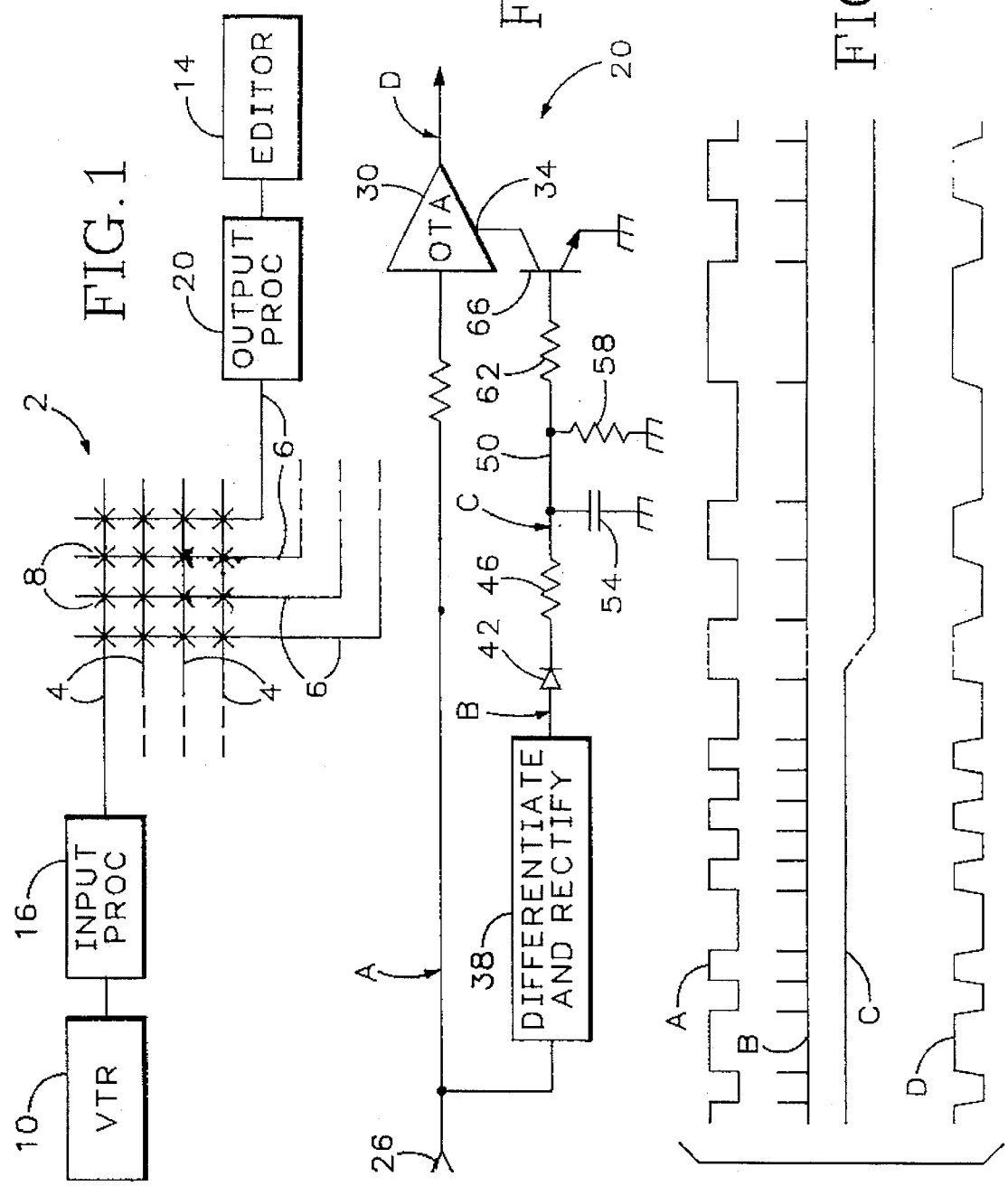

PROVIDING TRANSITIONS OF SLEW RATE DEPENDENT ON PULSE FREQUENCY

BACKGROUND OF THE INVENTION

This invention relates to a time code signal processing circuit.

ANSI/SMPTE standard 12M-1986 specifies a format and modulation method for a digital code to be recorded on a longitudinal track of video tape by a video tape recorder to facilitate timing and control in subsequent use of the recorded video material, for example in editing. The code, which is commonly known as SMPTE time code, specifies a unique and complete address on the video tape for each television frame. During playback of the video tape, the time code signal is read from the tape and is decoded.

The time code signal is a pulse signal, specifically a biphase signal. In biphase coding, a signal epoch is divided into time slots, and one source data bit occupies a single time slot. Each source data bit may be represented by a two-cell doublet. Each coding doublet begins, and therefore also ends, with a transition. A source data bit one generates a transition between the two cells of the doublet, whereas a source data bit zero does not.

Standard 12M-1986 prescribes that the transition time of the pulse signal, i.e. the rise time and the fall time, shall be 25±5 µs, corresponding to a slew rate from $41.67*V_{pp}$ v/ms to $62.5*V_{pp}$ v/ms, where $V_{pp}$ is the peak-to-peak voltage of the time code signal, and devices designed for utilizing the time code signal are generally designed around this range of slew rates.

A video tape recorder designed for professional use has a wide range of playback speeds typically ranging from jog (one frame per second) through normal (about 30 frames per second) to shuttle (64 frames per second). Since the time code signal is synchronized with the video signal, this implies that the slew rate of the time code pulses can vary between about one-thirtieth the slew rate at normal speed and about 64 times the slew rate at normal speed, and that the slew rate is linearly related to the time code signal's data rate. Furthermore, the amplitude of the time code signal provided by a conventional VTR may vary depending on playback speed, such that the amplitude at high speed is greater than at normal speed and the amplitude at low speed is less than at normal speed. The wide range of variation in slew rate and the variation in amplitude can lead to difficulties, particularly in clocked propagation of the time code signal. In particular, a routing switcher designed for switching a digital signal normally requires that the signal that is being switched have a fairly narrow range of slew rates and amplitudes. Therefore conventional switchers are not well suited to switching time code signals.

SUMMARY OF THE INVENTION

According to the first aspect of the present invention there is provided a method of processing a pulse signal that has been read from a longitudinal track of a recording medium being displaced for playback at a variable speed, said method comprising applying the pulse signal to an amplifier that generates an output pulse having transitions of which the slew rate is dependent on a bias current applied to the amplifier, generating a voltage representative at least substantially of the frequency of occurrence of pulses in the pulse signal, and generating the bias current in response to said voltage.

According to a second aspect of the present invention there is provided a circuit for processing an input pulse signal of which the slew rate is dependent on pulse frequency, comprising an amplifier means for receiving the input pulse signal and generating an output pulse signal having transitions of which the slew rate is dependent on a bias current supplied to the amplifier means, and a means for supplying bias current to the amplifier means, the bias current being representative at least substantially of the frequency of occurrence of pulses in the input pulse signal.

BRIEF DESCRIPTION OF THE DRAWINGS

For a better understanding of the invention, and to show how the same may be carried into effect, reference will now be made, by way of example, to the accompanying drawings, in which:

FIG. 1 is a block diagram illustrating a distribution switcher for switching a time code signal, FIG. 2B is a more detailed illustration of the output processor shown in FIG. 2A, FIG. 3 is a graph illustrating waveforms at various points of the circuit shown in FIG. 2B.

DETAILED DESCRIPTION

Figure 2A:
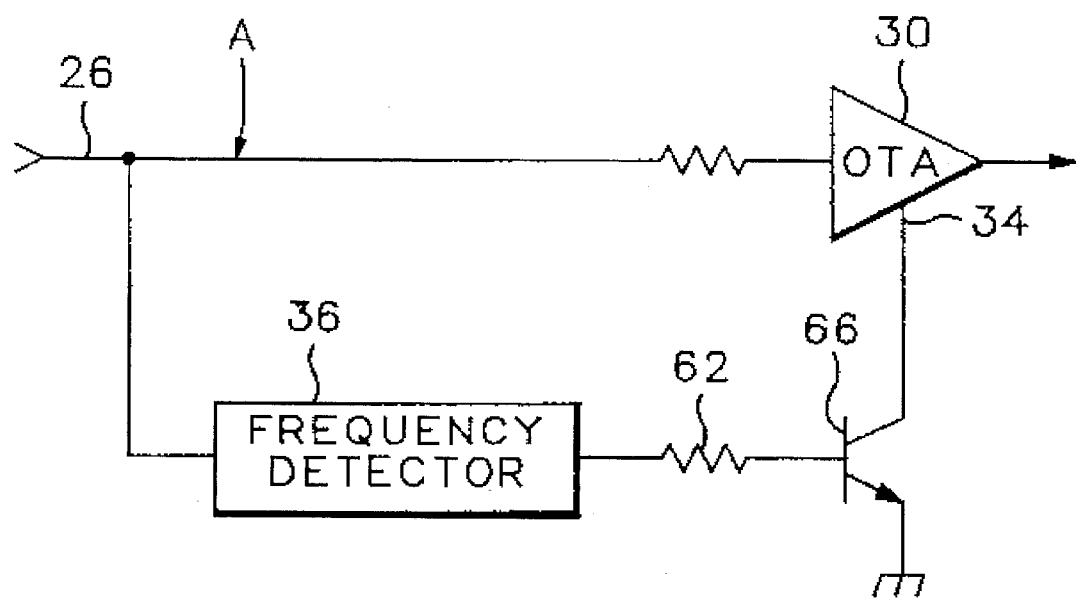
FIG. 2A is a partially schematic black diagram illustrating one form of the output processor shown in FIG. 1.

The switcher shown in FIG. 1 is a 4×4 crosspoint switcher having a matrix core 2 in which any selected input line 4 can be connected to any one or more output lines 6 by selective closing of one or more crosspoint elements 8. The input lines are connected to respective signal sources, one of which is the time code output of a video tape recorder (VTR) 10, and the output lines are connected to respective signal destinations, one or more of which may be a video tape editor 14 or other time code utilization device.

The crosspoint elements of the matrix core are designed to propagate signals having standard logic levels and slew rates. For the reasons explained previously, the amplitude and slew rate of the time code signal provided by the VTR 10 depend on the playback speed of the VTR. Accordingly, an input processor 16 is interposed between the VTR 10 and the matrix core. The input processor 16 shapes the waveform of the time code signal so that the signal has a constant amplitude that matches the logic levels of the crosspoint elements and the slew rate is essentially independent of frequency and is within the range of slew rates that is acceptable to the crosspoint elements.

The editor 14 is designed to operate on a time code signal of which the slew rate is proportional to the signal's date rate. The slew rate of the output signal provided by the matrix core 2 when it selects the input processor 16 is essentially independent of data rate. Accordingly, an output processor 20 is interposed between the matrix core and the editor 14 in order to provide the editor 14 with a time code signal having a slew rate that is dependent on data rate.

As shown in FIG. 2A, the output processor 20 has an input terminal 26 at which it receives the pulse signal (FIG. 3, waveform A) derived from the time code signal provided by the VTR. The signal epoch shown in FIG. 3 is divided into two intervals, at the left and right respectively of FIG. 3, and in the interval at the left the data rate is twice that at the right. The slew rate of the pulse is substantially independent of pulse frequency. Thus, during each interval, the waveform A is shown as being a square wave having essentially instantaneous transitions. The input pulse signal is applied to an operational transconductance amplifier (OTA) 30, which responds to each transition of its input signal by generating a corresponding transition in its output signal with a slew rate that depends on the current supplied to its bias current input 34.

The output processor also comprises a frequency detector 36 that receives the input pulse signal. The output of the frequency detector 36 is; further connected through a further resistor 62 to the base of a transistor 66. The collector of the transistor 66 is connected to the bias current input 34 of the amplifier 30 and its emitter is grounded.

In operation, voltage at the output of the frequency detector 36; node 50 depends on the average pulse frequency. See FIG. 3, waveform C. This voltage supplies base current to the transistor 66 through the resistor 62, and the resulting collector current is supplied as bias current to the operational transconductance amplifier. Consequently, the bias current depends on the frequency of transitions in the input pulse signal received at the terminal 26. Although a source data bit one of the time code signal results in two transitions whereas a source data bit zero results in a single transition, the average transition frequency is a fairly accurate measure of the data rate of the time code signal. Therefore, the output signal of the OTA 30 (FIG. 3, waveform D) is a pulse signal in which the slew rate depends on the data rate of the time code signal.

Referring to FIG. 2B, the frequency detector 36 has an input stage 38 that differentiates and rectifies the input pulse signal at the terminal 26 to provide a signal (FIG. 3, waveform B) containing one pulse for each transition of the input pulse signal. The output of the input stage is connected through a diode 42 and a resistor 46 to a node 50, which is the output of the frequency detector. A capacitor 54 and a second resistor 58 are connected in parallel between the node 50 and ground. The output signal of the input stage 38 charges the integrating capacitor 54 through the diode 42 and the resistor 46 so that the voltage at the node 50 depends on the average pulse frequency.

The component values for the capacitor 54 and the resistors 46 and 58 are selected so that the time constants that they establish allow the voltage at the node 50 to follow the average pulse frequency over a period of about 44 ms.

Figure 4:
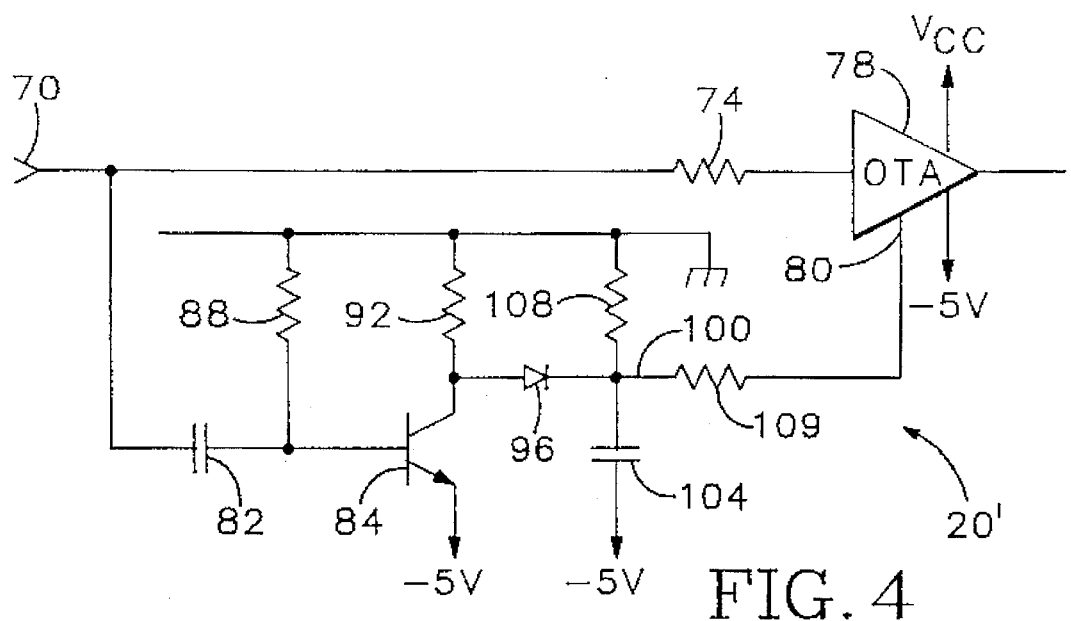
FIG. 4 is a schematic diagram of a second form of the output processor shown in FIG. 1.

FIG. 4 illustrates an alternative form of the output processor.

The output processor shown in FIG. 4 has an input terminal 70 at which it receives the time code signal. The input terminal 70 is connected through a resistor 74 to the input of an OTA 78 having a bias current input 80.

The input terminal 70 is also connected to one side of a differentiating capacitor 82 whose other side is connected to the base of a transistor 84. The transistor 84 is biased by a resistor 88 that is connected to ground, and the emitter of the transistor is connected to the −5 volt supply. The collector of the transistor 84 is connected through resistor 92 to ground and through a diode 96 to a node 100. A capacitor 104 is connected between the node 100 and the −5 volt supply, and a resistor 108 is connected between the node 100 and ground. The node 100 is connected to the bias current input 80 of the OTA 78 through a resistor 109.

In operation of the circuit shown in FIG. 4, a biphase signal is received at the terminal 70. As in the case of FIG. 2A and 2B, the OTA 78 provides an output signal having one transition for each transition of the input signal, the slew rate of the transitions to the output signal being dependent on the current supplied to the bias current input of OTA 78.

Figure 5:
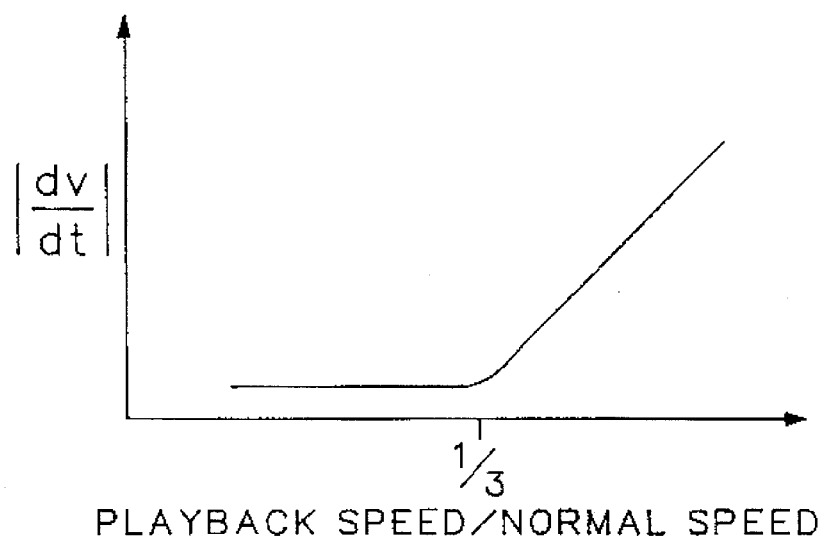
FIG. 5 is a graph illustrating a feature of the output processor shown in FIG. 4.

The biphase coded signal at the terminal 70 is differentiated by the capacitor 82. A falling edge transition at the terminal 70 results in a negative-going pulse at the base of the transistor. A negative-going pulse at the base of transistor 84 results in a positive-going pulse at the collector of the transistor, charging the capacitor 104 through diode 96. It will be appreciated that a rising edge transition at the terminal 84 results in a positive-going pulse at the base of the transistor 84 and a negative-going pulse at the collector of the transistor 84, and that the diode 96 is reverse biased and prevents discharge of the capacitor. Therefore, the capacitor 104 is charged to a voltage that depends on the frequency of positive-going pulses at the collector of the transistor 84, and the resistor 109 supplies a current proportional to this voltage to the bias current input 80 of the OTA 78. In an implementation of the circuit shown in FIG. 4, the OTA 78 is an LM3080 integrated circuit in which the input 80 is the reference current input of a Widlar current mirror circuit and is maintained at a constant voltage of −4.3 volts. At a time code data rate corresponding to less than one third of normal playback speed, the voltage at node 100 approaches −4.3 volts and the bias current supplied to the OTA is constant and depends on the value of the resistor 108. At playback speeds higher than one third normal, the voltage at node 100 increases linearly with data rate and reaches a maximum of −0.7 volts at a pulse rate corresponding to shuttle speed. Therefore, the output signal of the OTA is a pulse signal in which, at a time code data rate corresponding to about one third of normal playback speed or lower, the slew rate of the transitions of the output signal of the OTA is approximately constant, and at higher data rates the slew rate varies approximately linearly with playback speed, as shown in FIG. 5.

It will be appreciated that the invention is not restricted to the particular embodiments that have been described, and that variations may be made therein without departing from the scope of the invention as defined in the appended claims and equivalents thereof. For example, the invention is not restricted to use in connection with apparatus for clocked propagation of a time code pulse signal, and can be applied in other situations where it is necessary to adjust the slew rate of a pulse signal. The circuit could be designed so that the slew rate of the time code pulses varies linearly with playback speed below one third of normal playback speed. However, this would result in increased circuit complexity and cost. Furthermore, increasing the rise time of the pulses at playback speeds below one third normal does not provide a performance advantage.

We claim:

1. A method of processing a pulse signal that has been read from a longitudinal track of a recording medium being displaced for playback at a variable speed and has been pre-processed so that it has transitions of which slew rate is substantially independent of pulse frequency, said method comprising:

applying the pulse signal to an amplifier that responds to each pulse of the pulse signal by generating an output pulse having transitions of which slew rate is dependent on a bias signal applied to the amplifier, generating a control signal that is dependent on average frequency of occurrence of pulses in the pulse signal, and applying said control signal to the amplifier as said bias signal, whereby the slew rate of the transitions of the output pulses generated by the amplifier is dependent on said average frequency.

2. A method according to claim 1, wherein the control signal that is applied to the amplifier as the bias signal is a current signal, and the step of generating the control signal comprises generating a voltage signal and generating the current signal in response to said voltage signal.

3. A method according to claim 2, wherein the step of generating the voltage signal comprises delivering charge to a capacitor in response to at least one transition of each pulse of the pulse signal, whereby the capacitor is charged to a voltage that depends on average pulse frequency.

4. A method according to claim 2, wherein the step of generating the voltage signal comprises delivering charge to a capacitor in response to each transition of each pulse of the pulse signal, whereby the capacitor is charged to a voltage that depends on average pulse frequency.

5. A method according to claim 1, wherein the step of generating the control signal comprises delivering charge to a capacitor in response to at least one transition of each pulse of the pulse signal, whereby the capacitor is charged to a voltage that depends on average pulse frequency.

6. A method according to claim 1, wherein the step of generating the control signal comprises delivering charge to a capacitor in response to each transition of each pulse of the pulse signal, whereby the capacitor is charged to a voltage that depends on average pulse frequency.

7. A circuit for processing an input pulse signal that has been read from a longitudinal track of a recording medium being displaced for playback at a variable speed and has been pre-processed so that it contains pulses of which slew rate is substantially independent of pulse frequency, comprising:

an amplifier means for receiving the input pulse signal and generating an output pulse signal having transitions of which slew rate is dependent on a bias signal supplied to the amplifier means, a means for generating a control signal dependent on average frequency of occurrence of pulses in the input pulse signal, and a means for supplying the control signal to the amplifier means as said bias signal, whereby the slew rate of the transitions of the output pulse signal depends on said average frequency.

8. A circuit according to claim 7, wherein the amplifier means is such that the slew rate of the transitions of the output pulse signal generated by the amplifier means is dependent on a bias current signal supplied to the amplifier means.

9. A circuit according to claim 8, wherein the means for generating the control signal comprises a frequency-to-voltage converter means for generating a voltage representative at least substantially of the pulse frequency of the input pulse signal and a means responsive to said voltage for supplying said bias current signal.

10. A circuit according to claim 9, wherein the frequency-to-voltage converter means comprises a capacitor and a means for delivering charge to the capacitor in response to at least one transition of each pulse of the input pulse signal.

11. A circuit for processing an input pulse signal that has been read from a longitudinal track of a recording medium being displaced for playback at a variable speed and has been pre-processed so that it contains pulses of which slew rate is substantially independent of pulse frequency, comprising:

an amplifier means for receiving the input pulse signal and generating an output pulse signal having transitions of which slew rate is dependent on a bias current supplied to the amplifier means, a means for differentiating the input pulse signal and generating a pulse in response to each transition of the input pulse signal, a capacitor that is charged by the pulses generated by the differentiating means to a voltage dependent on the frequency of transitions of the input pulse signal, and a means responsive to said voltage for supplying bias current to the amplifier means, whereby the slew rate of the transitions of the output pulse signal depends on said frequency of transitions.

\* \* \* \* \*

UNITED STATES PATENT AND TRADEMARK OFFICE
CERTIFICATE OF CORRECTION

PATENT NO. : 5,543,976
DATED : August 6, 1996
INVENTOR(S) : Birney D. DAYTON et al It is certified that error appears in the above-identified patent and that said Letters Patent is hereby corrected as shown below:

Cover page, left column, item [54] (the title) should read:

TIME CODE SIGNAL PROCESSING CIRCUIT PROVIDING TRANSITIONS OF SLEW RATE DEPENDENT ON PULSE FREQUENCY

Column 1, lines 1 and 2, the title should read:

TIME CODE SIGNAL PROCESSING CIRCUIT PROVIDING TRANSITIONS
OF SLEW RATE DEPENDENT ON PULSE FREQUENCY

Signed and Sealed this

Third Day of December, 1996

Attest:

BRUCE LEHMAN

Attesting Officer     Commissioner of Patents and Trademarks

UNITED STATES PATENT AND TRADEMARK OFFICE
CERTIFICATE OF CORRECTION

PATENT NO. : 5,543,976
DATED : August 6, 1996
INVENTOR(S) : Birney D. Dayton et al It is certified that error appears in the above-indentified patent and that said Letters Patent is hereby corrected as shown below:

On the title page, item [22] and item [51] should be included:
Related U.S. Application Data

[63] Continuation of Application No. 08/187,097 filed January 24, 1994, abandoned, which is a Divisional of Application No. 07/945,113 filed September 14, 1992, Patent 5,315,449.

Column 1, lines 2 and 3, between the title and the heading BACKGROUND OF THE INVENTION should be included:

CROSS-REFERENCE TO RELATED APPLICATION

This is filed as a continuation of co-pending Application No. 08/187,097 filed January 24, 1994, abandoned, which was filed as a divisional of co-pending Application No. 07/945,113 filed September 14, 1992, now Patent 5,315,449.

Signed and Sealed this

Eleventh Day of February, 1997

Attest:

BRUCE LEHMAN

Attesting Officer

Commissioner of Patents and Trademarks